(12) United States Patent
Kamikawa

(10) Patent No.: US 6,435,199 B1
(45) Date of Patent: Aug. 20, 2002

(54) TREATMENT APPARATUS

(75) Inventor: Yuji Kamikawa, Koshi-Machi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/551,951

(22) Filed: Apr. 19, 2000

(30) Foreign Application Priority Data

Apr. 20, 1999 (JP) ............................................. 11-111586

(51) Int. Cl.⁷ ................................................. B08B 3/04
(52) U.S. Cl. ........................... 134/76; 134/89; 134/88; 134/902; 134/64 R
(58) Field of Search ........................... 134/76, 89, 137, 134/140, 902, 88, 64 R

(56) References Cited

U.S. PATENT DOCUMENTS

| 3,143,975 A | * | 8/1964 | Abbey |
| 3,691,988 A | * | 9/1972 | Clarke |
| 4,520,834 A | * | 6/1985 | Dicicco |
| 4,575,299 A | * | 3/1986 | Layton et al. |
| 5,361,789 A | * | 11/1994 | Yoshida et al. |
| 5,853,496 A | * | 12/1998 | Honda |
| 5,915,396 A | * | 6/1999 | Konose |
| 5,950,643 A | * | 9/1999 | Miyazaki et al. |
| 5,997,656 A | * | 12/1999 | Kim |
| 6,074,515 A | * | 6/2000 | Iseki et al. |

FOREIGN PATENT DOCUMENTS

| JP | 3-188631 | * | 8/1992 |
| JP | 4-255220 | * | 9/1992 |
| JP | 5-62955 | * | 3/1993 |

* cited by examiner

Primary Examiner—Frankie L. Stinson
(74) Attorney, Agent, or Firm—Morrison & Foerster LLP

(57) ABSTRACT

In an apparatus for treating semiconductor wafers, a plurality of chemical treatment tanks 21a to 21c filled with treatment liquids for processing semiconductor wafers W and a plurality of rinse treatment tanks 22a to 22c filled with rinse liquids for rinsing the semiconductor wafers W are disposed in a direction across the direction of conveyance of a wafer holder conveyor carriage 5, such as a direction perpendicular thereto. A transportation device provided with a wafer boat 14 is disposed at a position in the vicinity of the chemical treatment tanks 21a to 21c and the rinse treatment tanks 22a to 22c, to transfer the wafers W to and from the wafer holder conveyor carriage 5 and also transport the thus transferred wafers W to the chemical treatment tanks 21a to 21c and the rinse treatment tanks 22a to 22c. This configuration makes it possible to reduce the size of the treatment apparatus and also improve the processing efficiency thereof.

19 Claims, 10 Drawing Sheets

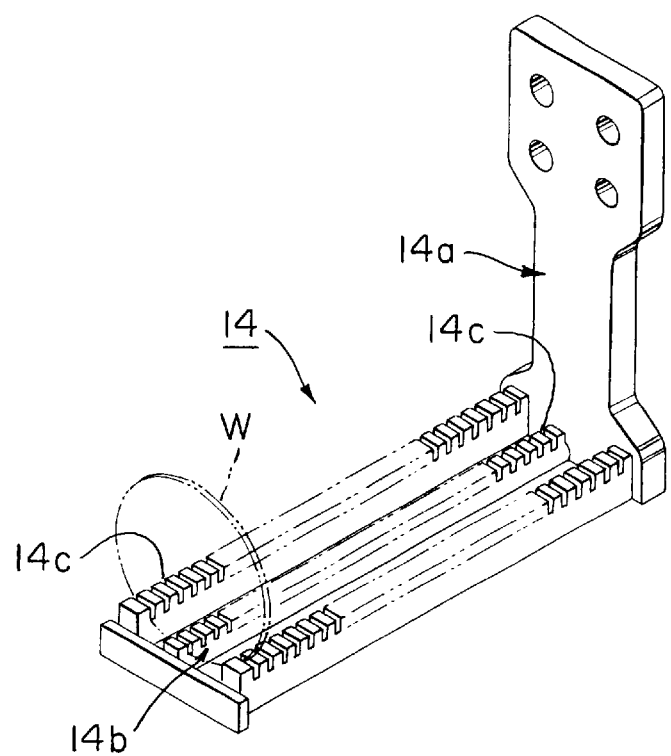
F I G. 5
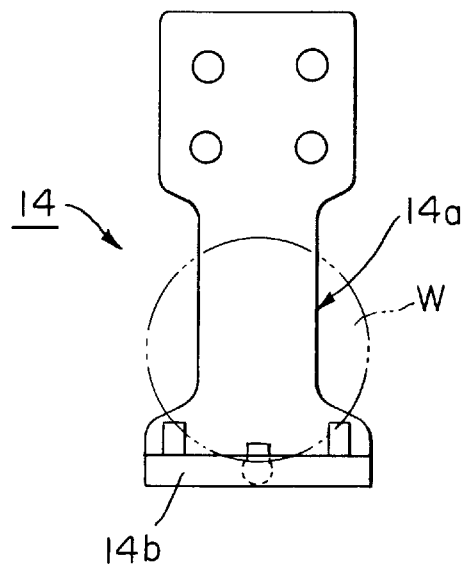
F I G. 6

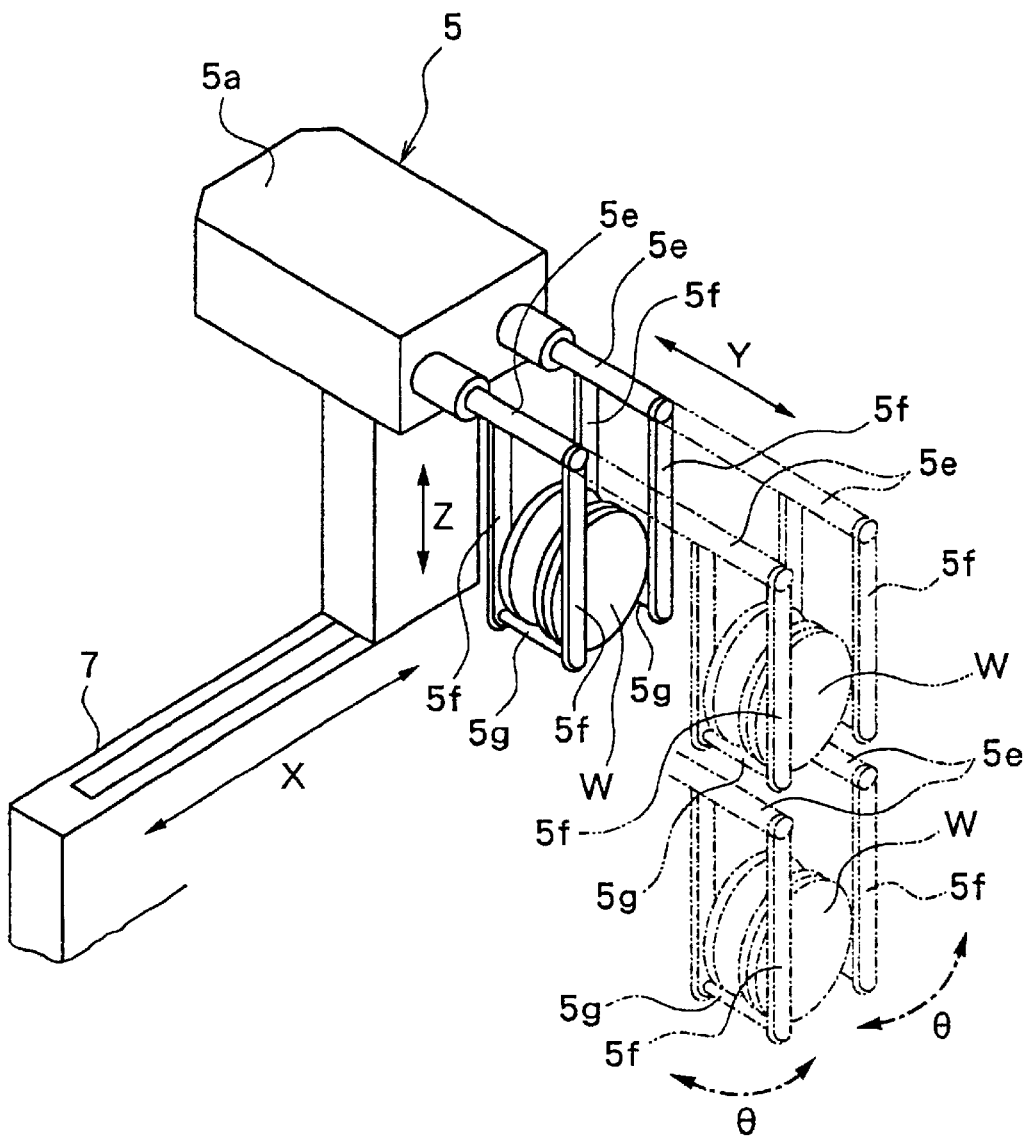
F I G. 10

TREATMENT APPARATUS

BACKGROUND OF THE INVENTION

1. Technical Field

The present invention relates to a treatment apparatus and, in particular, to a treatment apparatus that subjects an object to be treated, such as a semiconductor wafer or a glass substrate for an LCD, to a process such as washing.

2. Description of Related Art

An apparatus is generally used in the process of fabrication of a semiconductor device wherein, after an object to be treated such as a semiconductor wafer or a glass substrate for an LCD (hereinafter referred to as a "wafer") has been immersed sequentially in treatment vessels such as treatment tanks, each filled with a treatment liquid such as a chemical (ammonia water or hydrogen fluoride, by way of example) or a rinse liquid or the like, it is immersed in a rinse liquid to remove any particles adhering to the surfaces of the wafer and any heavy metals such as nickel (Ni) or chrome (Cr) or natural oxide films that have been attracted either chemically or physically thereto.

A plurality of chemical treatment tanks filled with various treatment liquids, such as chemicals, and a plurality of rinse treatment vessels filled with rinse liquids such as pure water are provided in this treatment apparatus together with other components such as a conveyor device for conveying the wafer with respect to these treatment tanks and a conveyor carriage to which is attached a wafer holder mechanism such as a wafer chuck. These treatment tanks, in other words, the plurality of chemical treatment tanks and the plurality of rinse treatment tanks, are disposed in a straight line along the direction of movement of the conveyor carriage with the attached wafer holder mechanism. Wafers are conveyed sequentially to predetermined chemical treatment tanks and rinse treatment tanks by the conveyor carriage with attached wafers holder mechanism; then the wafers are immersed in the treatment liquids by a transportation device that is disposed in close proximity to the treatment tanks, such as a transportation device comprising a wafer boat; and finally the wafers are immersed in the rinse liquids to remove any particles that are adhering to the surfaces of the wafers and any heavy metals such as Ni or Cr or natural oxide films that have been attracted either chemically or physically thereto. Alternatively, no wafers boat is used and the conveyor carriage with attached wafers holder mechanism is raised and lowered to immerse the wafer in the treatment liquids and then into the rinse liquids to remove any particles that are adhering to the surfaces of the wafers and any heavy metals such as Ni or Cr or natural oxide films that have been attracted either chemically or physically thereto.

In this type of prior-art treatment apparatus, the chemical treatment tanks and the rinse treatment tanks are disposed in a straight line parallel to the direction of movement of the conveyor carriage with attached wafer holder mechanism. This raises a problem in that entire treatment apparatus becomes long in the direction in which the object to be treated is conveyed, so that not only does the treatment apparatus become large, but also time is required for conveying the wafer to the treatment tanks, leading to a drop in the treatment efficiency.

The present invention was devised in the light of the above described problem and has as an object thereof the provision of a treatment apparatus that makes it possible to reduce the size of the apparatus and improve the treatment efficiency.

SUMMARY OF THE INVENTION

In order to achieve the above object, a treatment apparatus in accordance with the present invention comprises a plurality of treatment vessels disposed in mutual close proximity, for processing an object; a holder conveyor carriage for holding the object to convey the object into the plurality of treatment vessels, the holder conveyor carriage being movable along a conveyor path in a fixed direction of conveyance; and the plurality of treatment vessels being disposed in a direction across the direction of conveyance of the holder conveyor carriage.

According to another aspect of the invention, there is provided a treatment apparatus comprising: a housing; a plurality of treatment vessels disposed in mutual close proximity within the housing, for processing an object; a holder conveyor carriage for holding the object to convey the object to the plurality of treatment vessels, the holder conveyor carriage being movable along a conveyor path in a fixed direction of conveyance within the housing; and the plurality of treatment vessels being disposed in a direction across the direction of conveyance of the holder conveyor carriage.

According to a further aspect of the invention, there is provided a treatment apparatus comprising: a housing; a conveyor section for conveying an object into and out of the housing; a plurality of treatment vessels disposed in mutual close proximity within the housing, for processing the object; a drying device provided within the housing, for drying said object; a holder conveyor carriage for holding the object and moving between the conveyor section and the treatment vessels along a conveyor path in a fixed direction of conveyance, to convey the object to the drying device and the plurality of treatment vessels; and the plurality of treatment vessels being disposed in a crossing direction across the direction of conveyance of the holder conveyor carriage.

The treatment apparatus of this invention, configured as described above, makes it possible to reduce the length of conveyance of the conveyor carriage and also cause the object, which has been conveyed by the conveyor carriage, into the treatment vessels by the transportation device, for processing. This therefore makes it possible to reduce the size of the apparatus and also improve the processing efficiency.

In addition, it is possible to transport the object into the above described plurality of treatment vessels by providing a holder device on the conveyor carriage that holds the object in such a manner as to be capable of freely expanding and contracting on the side of the plurality of treatment vessels. This makes it possible to transport the object into each of the treatment vessels by the conveyor device alone, without using a transportation device, which makes it possible to reduce the number of structural components and also reduce the size of the treatment apparatus even further and improve the treatment efficiency.

BRIEF DESCRIPTION OF DRAWINGS

FIG. 5 is a perspective view of an example of a wafer boat as a wafer supporter;

FIG. 6 is a front view of the wafer boat shown in FIG. 5;

FIG. 10 is a perspective view of a wafer holder conveyor carriage in the third embodiment.

DESCRIPTION OF THE PREFERRED EMBODIMENTS

Embodiments of the present invention will be described below with reference to the accompanying drawings. The embodiments that are described below relate to the application of the present invention to processing for washing semiconductor wafers.

First Embodiment

Figure 1:
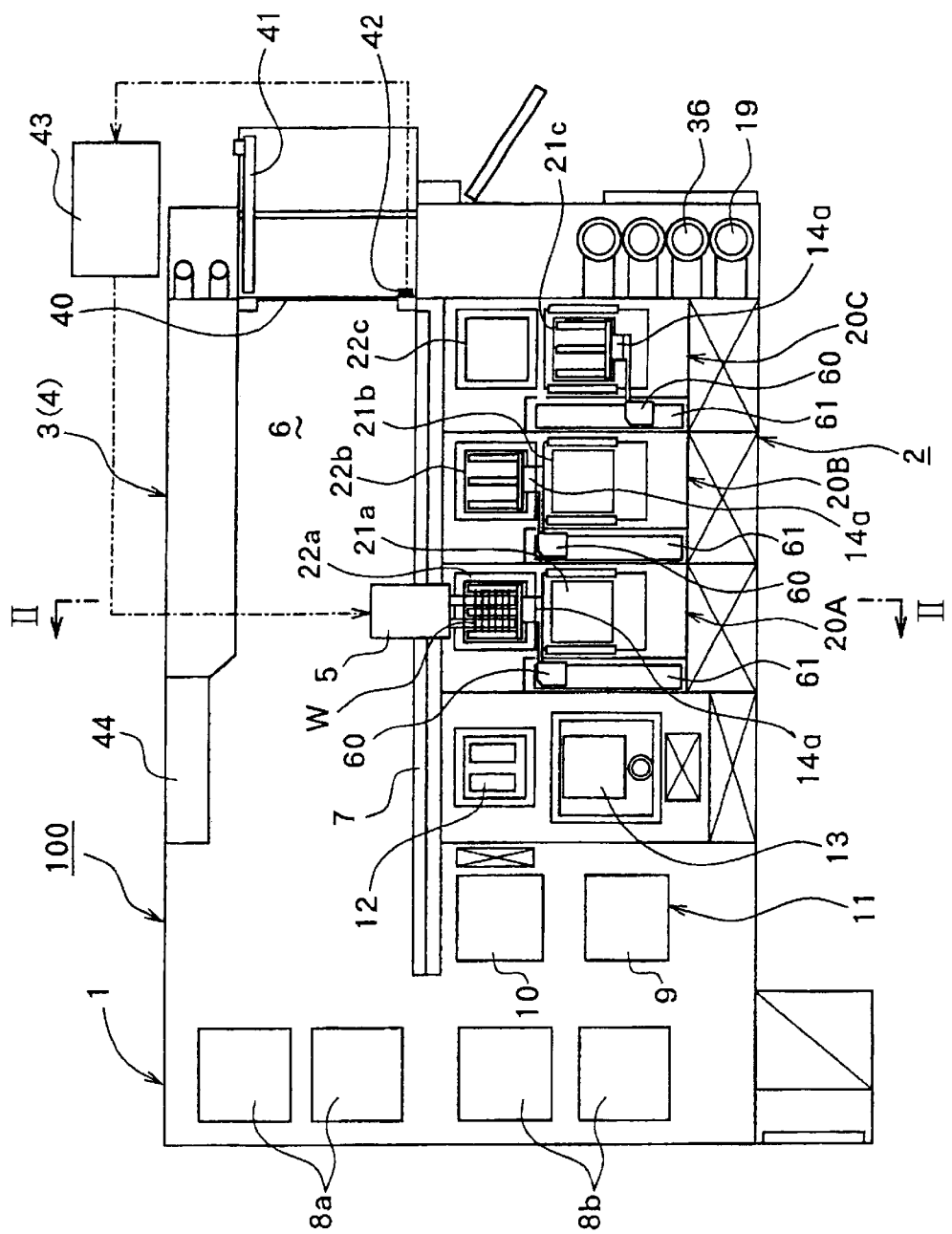
FIG. 1 is a schematic plan view of a treatment apparatus in accordance with this invention.
Figure 2:
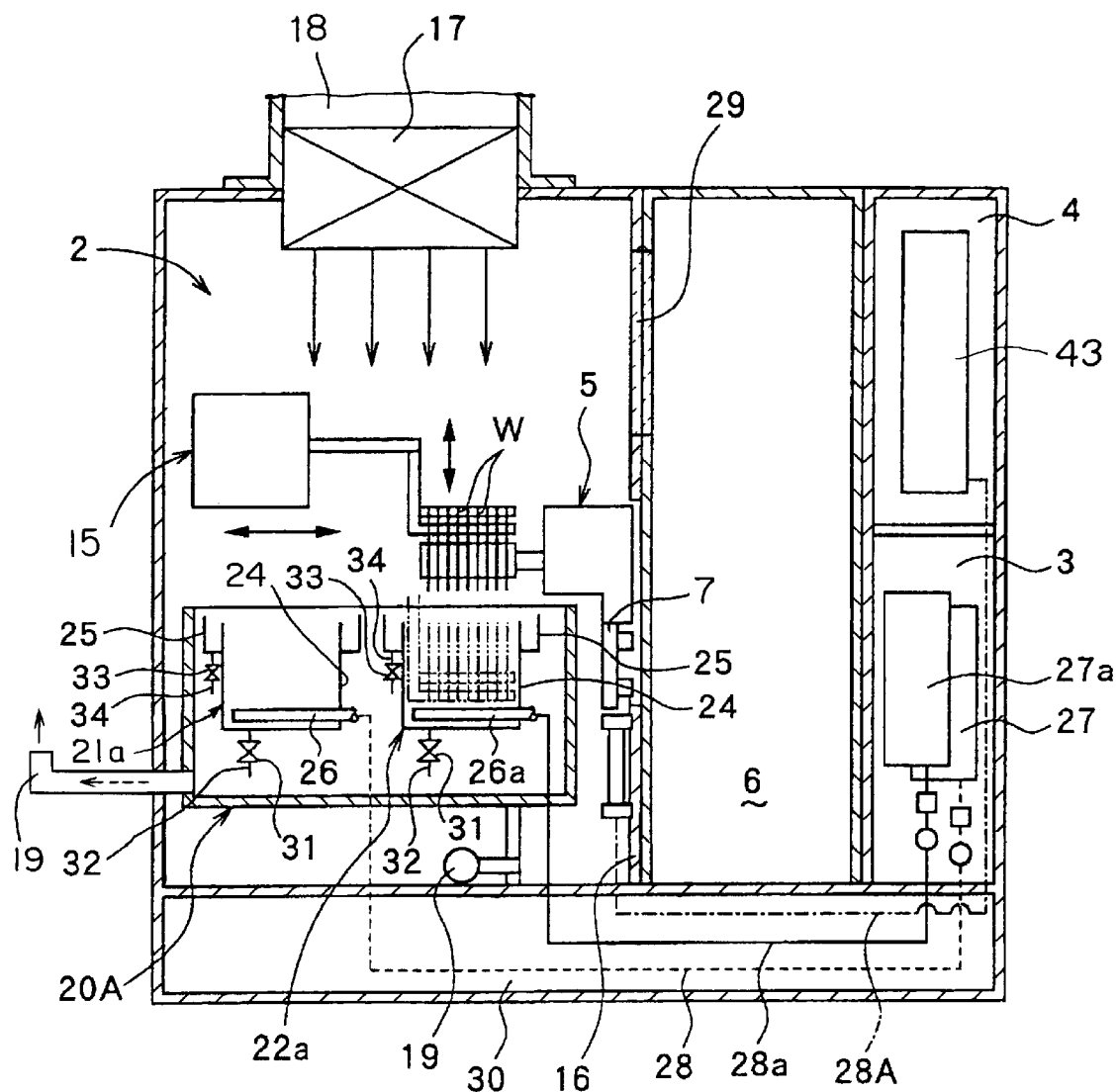
FIG. 2 is a vertical section taken along the line II—II of FIG. 1.

A first embodiment of a treatment apparatus in accordance with this invention is shown in FIGS. 1 to 4. In the plan view of FIG. 1, the treatment apparatus has a housing 100 and the structural elements described below are provided within this housing 100. First of all, this treatment apparatus is provided with a conveyor section 1, which conveys semiconductor wafers W (hereinafter referred to as "wafers W") that are the objects to be treated into and out of the treatment apparatus, at one end of the housing 100. The apparatus is also provided with a treatment section 2 in which the wafers W are subjected to a certain treatment, such as washing; a treatment fluid accommodation section 3 (hereinafter called a first accommodation section 3) for accommodating treatment fluids such as liquid chemicals and rinse liquids used in the washing or other treatment, together with pressurized gases; and a control equipment accommodation section 4 (hereinafter called a second accommodation section 4). As shown in FIG. 2, which is a section taken along the line II—II of FIG. 1, the first accommodation section 3 can be disposed on the lower side of the second accommodation section 4. The accommodation supply section 4, which is the control equipment accommodation section, accommodates control equipment that issues drive and control signals for a conveyor means such as a wafer holder conveyor carriage 5 that will be described later.

A maintenance/inspection section 6 is provided between the treatment section 2 and the first and second accommodation sections 3 and 4 to separate the treatment section 2 from the first and second accommodation sections 3 and 4. A conveyor path, such as a conveyor rail 7, is laid out from the conveyor section 1 and along the boundary between the treatment section 2 and the maintenance/inspection section 6, with the configuration being such that the wafer holder conveyor carriage 5 moves along this conveyor rail 7. The wafer holder conveyor carriage 5 functions as a conveyor device for conveying a plurality of wafers W, such as fifty wafers, into a plurality of processing vessels such as chemical treatment tanks 21a to 21c and rinse treatment tanks 22a to 22c that are disposed within the treatment section 2.

As shown in FIG. 1, a carrier 8a that accommodates untreated wafers W and a carrier 8b that accommodates treated wafers W are placed in the conveyor section 1. Between the conveyor section 1 and the treatment section 2 are provided an attitude conversion device 9 for changing the orientation of a plurality of wafers, such as fifty wafers; an interface section 11 provided with a wafer transportation device 10 for transferring wafers between this attitude conversion device 9 and the wafer holder conveyor carriage 5; and a carrier conveyor device (not shown in the figure) for transferring the carrier 8a and the carrier 8b between the conveyor section 1 and the interface section 11.

A washing/drying unit 12 for the wafer holder conveyor carriage, a drying unit 13 that is provided with a drying vessel, a first washing unit 20A, a second washing unit 20B, and a third washing unit 20C are disposed within the treatment section 2, along the conveyor rail 7 from the side of the conveyor section 1 and the interface section 11. The washing/drying unit 12 for the wafer holder conveyor carriage and the drying unit (drying vessel) 13 are disposed in a direction that intersects the direction of movement of the wafer holder conveyor carriage 5, such as a direction perpendicular thereto. In other words, the washing/drying unit 12 for the wafer holder conveyor carriage and the drying unit 13 are disposed in a direction across the conveyor rail 7 (such as a direction perpendicular thereto).

The first washing unit 20A is provided with a first treatment vessel such as the chemical treatment tank 21a and a second treatment vessel such as the rinse treatment tank 22a, where the chemical treatment tank 21a and the rinse treatment tank 22a in the first washing unit 20A are disposed in a straight line in a direction across the direction of movement of the wafer holder conveyor carriage 5, such as a direction perpendicular thereto. This positional relationship is the same for the second washing unit 20B and the third washing unit 20C. In other words, the chemical treatment tank 21b and the rinse treatment tank 22b of the second washing unit 20B are disposed in a straight line in a direction across the direction of movement of the wafer holder conveyor carriage 5, such as a direction perpendicular thereto. Similarly, the chemical treatment tank 21c and the rinse treatment tank 22c of the second washing unit 20C are disposed in a straight line in a direction across the direction of movement of the wafer holder conveyor carriage 5, such as a direction perpendicular thereto. That is to say, the chemical treatment tanks 21a to 21c and the rinse treatment tanks 22a to 22c in the respective washing units 20A to 20C are in close mutual proximity and are disposed in straight lines intersecting the conveyor rail 7. In this case, the rinse treatment tanks 22a to 22c are disposed at positions close to the conveyor rail 7, in other words, close to the wafer holder conveyor carriage 5, and the chemical treatment tanks 21a to 21c are disposed at positions separated from the conveyor rail 7.

Figure 3:
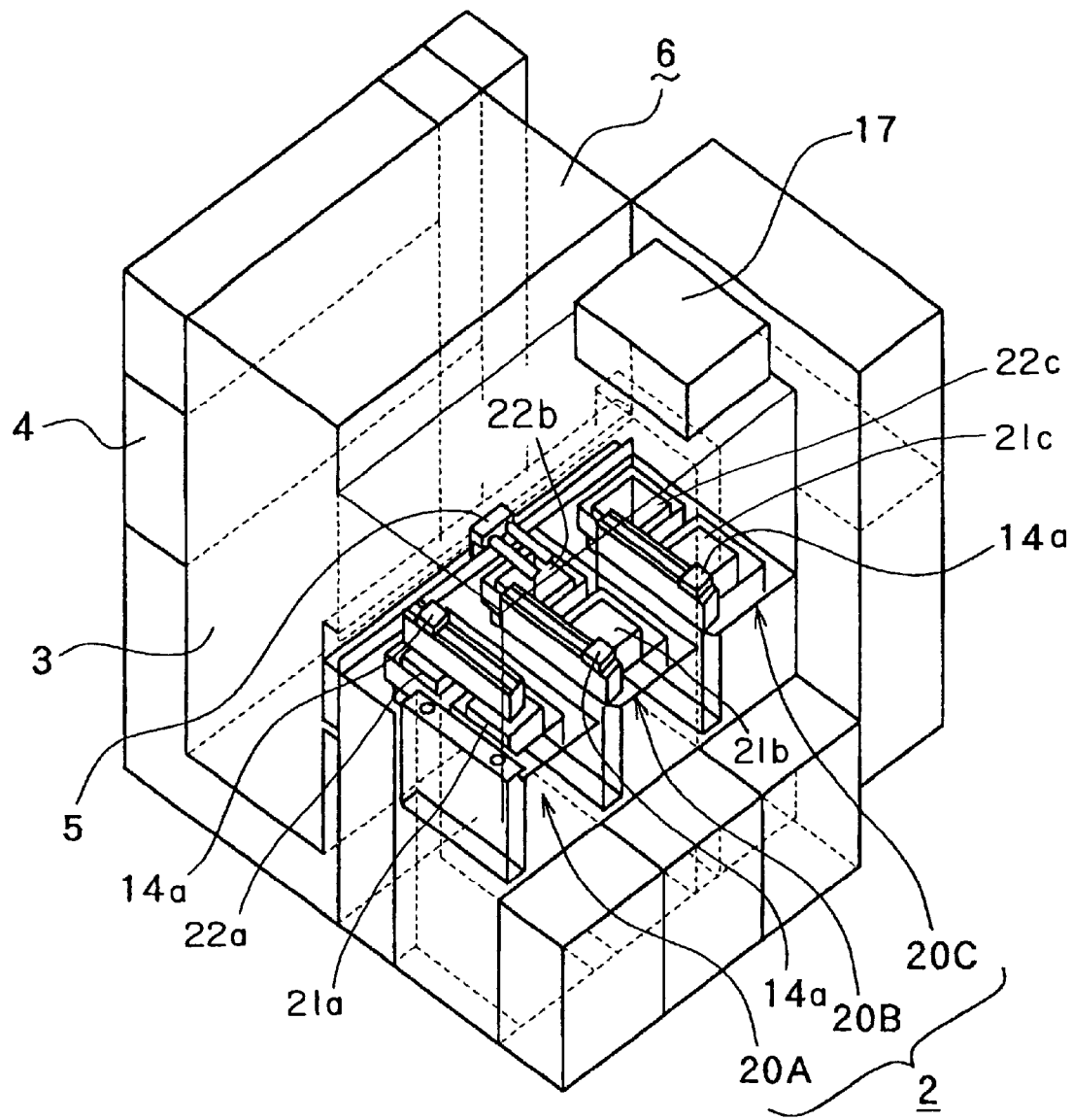
FIG. 3 is a schematic perspective view of a first embodiment of the present invention.
Figure 4:
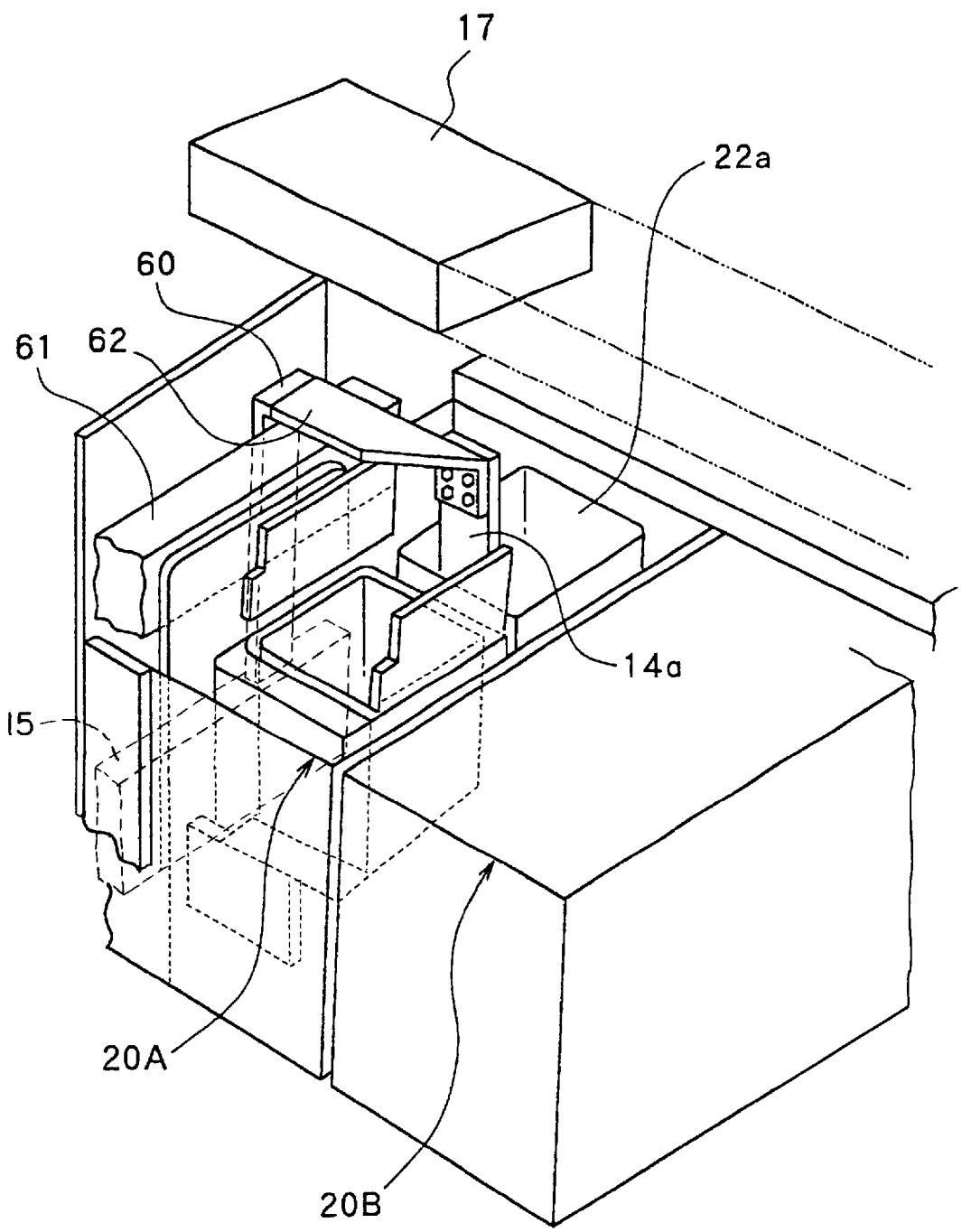
FIG. 4 is a schematic perspective view of essential components of the first embodiment.

As shown in FIGS. 3 and 4, a transportation device is provided in close proximity to the chemical treatment tanks 21a to 21c and the rinse treatment tanks 22a to 22c of the first to third washing units 20A to 20c in such a manner that it can deliver a plurality of wafers W, such as fifty wafers, to and from the wafer holder conveyor carriage 5, and cause the delivered wafers W to be lowered into and raised out of any of the chemical treatment tanks 21a to 21c and the rinse treatment tanks 22a to 22c. A wafer supporter such as a wafer boat 14 is comprised within this transportation device. The wafer boat 14 has a configuration that is known in the art and is constructed of a vertical suspender section 14a and a horizontal wafer support section 14b, as shown in FIGS. 5 and 6. Grooves 14c for supporting the wafers W in a vertical posture at a regular spacing are formed in three horizontal bars that configure the horizontal wafer support section 14b.

As shown in FIG. 4, a guide member 61 is provided in a horizontal direction parallel to the chemical treatment tank 21a and the rinse treatment tank 22a, with the configuration being such that a movable member 60 is guided in the horizontal direction by this guide member 61. The configuration of the movable member 60 is such that it can be driven by a horizontal and vertical drive mechanism to move in the horizontal and vertical directions. Note that a horizontal/vertical drive mechanism 15 is shown schematically in FIG. 2 for convenience, although it is not shown at the position it would occupy in practice. The upper end of the vertical suspender section 14a of the wafer boat 14 is attached by a horizontal bracket 62 to the movable member 60. The configuration is such that the movable member 60 is driven in the vertical direction by the horizontal/vertical drive mechanism 15, and the wafers W held in the wafer boat 14 are lowered (inserted) or raised (removed) with respect to any of the chemical treatment tanks 21a to 21c and the rinse treatment tanks 22a to 22c. It is therefore possible to transfer the wafers W between the wafer boat 14 and the wafer holder conveyor carriage 5, using the wafer boat 14 that is immersed in the rinse liquids within the rinse treatment tanks 22a to 22c to remove chemicals or the like.

By disposing the chemical treatment tanks 21a to 21c and the rinse treatment tanks 22a to 22c in a direction that intersects the direction of movement of the wafer holder conveyor carriage 5, such as a direction perpendicular thereto, as described above, it becomes possible to reduce the stroke of movement of the wafer holder conveyor carriage 5 and also reduce the installation space required for the treatment apparatus. In addition, the lowering (insertion) and raising (removal) of the wafers W into and out of the chemical treatment tanks 21a to 21c and the rinse treatment tanks 22a to 22c of the washing units 20A to 20C is done by the wafer boat 14 in common, whereby it is possible to facilitate adjustments of the positioning of the wafer boat 14 and also guarantee accurate positioning thereof, in comparison with a configuration in which a wafer boat is provided for each treatment tank. Since it is also possible to reduce the number of sensors required for purposes such as inspecting the positioning of the wafer boat, this could reduce the costs of the structural members.

The treatment section 2 is divided from the maintenance/inspection section 6 by a partitioning wall 16, as shown in FIG. 2, and an air introduction inlet 18 having a filter unit 17 is provided in a ceiling surface of the treatment section 2. An exhaust port 19 connected to exhaust vessel such as an exhaust blower fan (not shown in the figure) is provided in the treatment section 2. This ensures that air that has been cleaned is constantly supplied to the interior of the treatment section 2. In addition, a transparent viewing window 29 is provided in one section of the partitioning wall 16 to make it possible to monitor the interior of the treatment section 2 from within the maintenance/inspection section 6. As shown in FIG. 2, each of the chemical treatment tanks 21a to 21c and the rinse treatment tanks 22a to 22c disposed within the treatment section 2 is configured of an inner tank 24 filled with a chemical or a rinse liquid or the like (FIG. 2 shows the case of a first chemical and a first rinse liquid) and an outer tank 25 that is provided around the upper periphery of the inner tank 24 in order to collect chemicals and ringe liquid overflowing from the inner tank 24. A chemical supply nozzle pipe 26 or a rinse liquid supply nozzle pipe 26a is provided in a lower section of each inner tank 24. Each chemical supply nozzle pipe 26 is connected by a chemical supply pipeline 28 to a chemical tank (for different chemicals) 27 as a chemical supply source that is disposed within the first accommodation section 3, and each rinse liquid supply nozzle pipe 26a is similarly connected to a rinse liquid source such as a pure water supply source 27a and a pure water supply pipeline 28a that are disposed within the first accommodation section 3. In this case, the supply pipelines 28 and 28a are disposed within a space 30 provided in a lower section of the maintenance/inspection section 6. The connections between the chemical treatment tank 21a and rinse treatment tank 22a of the first washing unit 20A, the chemical tank 27, and the pure water supply source 27a in this configuration have already been described, but the supply pipelines 28 and 28a for the other washing units 20B and 20C are disposed within the space 30 in a similar manner. Within this space 30 is also provided piping 28A that is connected to a control device 43 accommodated within the second accommodation section 4 and a drive section for the wafer holder conveyor carriage 5, as shown in FIG. 2.

A drainpipe 32 that is provided with a first drain valve 31 is connected to an exhaust port (not shown in the figure) that is provided in a base section of the inner tank 24, and a second drainpipe 34 provided with a second drain valve 33 is connected to an exhaust port (not shown in the figure) that is provided in a base section of the outer tank 25. The configuration is such that exhaust liquids that are discharged through these drainpipes 32 and 34 flow to the exterior from an exhaust liquid pipeline 36 (FIG. 1) that is connected to a lower side section of the treatment section 2.

In FIG. 1, an access hatch 40 for operators is provided in the maintenance/inspection section 6 on the side opposite to that of the conveyor section 1, and a door 41 that can be opened and closed is attached to this access hatch 40. In this case, a sensor 42 is disposed in the access hatch 40 as a detector to detect the open state of the door 41. The configuration is such that a detection signal is transmitted from this sensor 42 to the control device 43, then a control signal is transmitted from the control device 43 to the drive section of the wafer holder conveyor carriage 5, to stop the driving of the wafer holder conveyor carriage 5 while the door 41 is open. Note that the control device 43 is shown within the treatment apparatus for ease of description in this case, but the control device 43 is actually accommodated within the second accommodation section 4.

Note also that the access hatch 40 has been described as being disposed on the side of the housing 100 that is opposite to the conveyor section 1, but it is not absolutely necessary to dispose the conveyor section 1 and the access hatch 40 on opposite sides. For example, at least one aperture section could be formed in the housing 100 and the conveyor section 1 and the access hatch 40 could be provided in that aperture section. It is also possible to provide aperture sections in two locations on opposite sides of the housing 100 and provide the conveyor section 1 in each of these aperture sections, so that wafers W can be conveyed in and out from both directions.

The above described first accommodation section 3 and second accommodation section 4 are formed in two stages, as shown in FIG. 2. The second accommodation section 4 that accommodates components such as the control device 43 is positioned in the upper stage and the first accommodation section 3 that accommodates components such as the treatment fluids such as chemicals and pressurized gases is positioned in the lower stage. Note that an IPA unit 44 comprising a tank of isopropyl alcohol (IPA), which is a source of a drying gas to be supplied to the drying unit 13 disposed within the above described treatment section 2, and an IPA gas generator is disposed at a position in the vicinity of the first and second accommodation sections 3 and 4, as shown in FIG. 1. Piping that connects this IPA unit 44 to the drying unit 13 is disposed within the space 30 formed in the lower section of the maintenance/inspection section 6, in a similar manner to the other pipelines 28.

With the treatment apparatus that is configured as described above, the treatment section 2 is separated from the first and second accommodation sections 3 and 4 by the maintenance/inspection section 6, making it possible to configure the treatment apparatus without having to provide a maintenance/inspection space outside the apparatus itself. In addition, when it comes to perform various tasks such as replacing the chemicals and inspecting the control equipment, or inspecting and monitoring the processing within the treatment apparatus, for example, this configuration facilitates tasks such as replacement and inspection because they can be done within the maintenance/inspection section 6. When the door 41 of the maintenance/inspection section 6 is opened in such a case, the sensor 42 detects that fact and transmits a corresponding signal to the control device 43, then the drive of the wafer holder conveyor carriage 5 is halted by a control signal from the control device 43, making it possible for the operator to perform these replacement and inspection tasks in safety.

Second Embodiment

Figure 7:
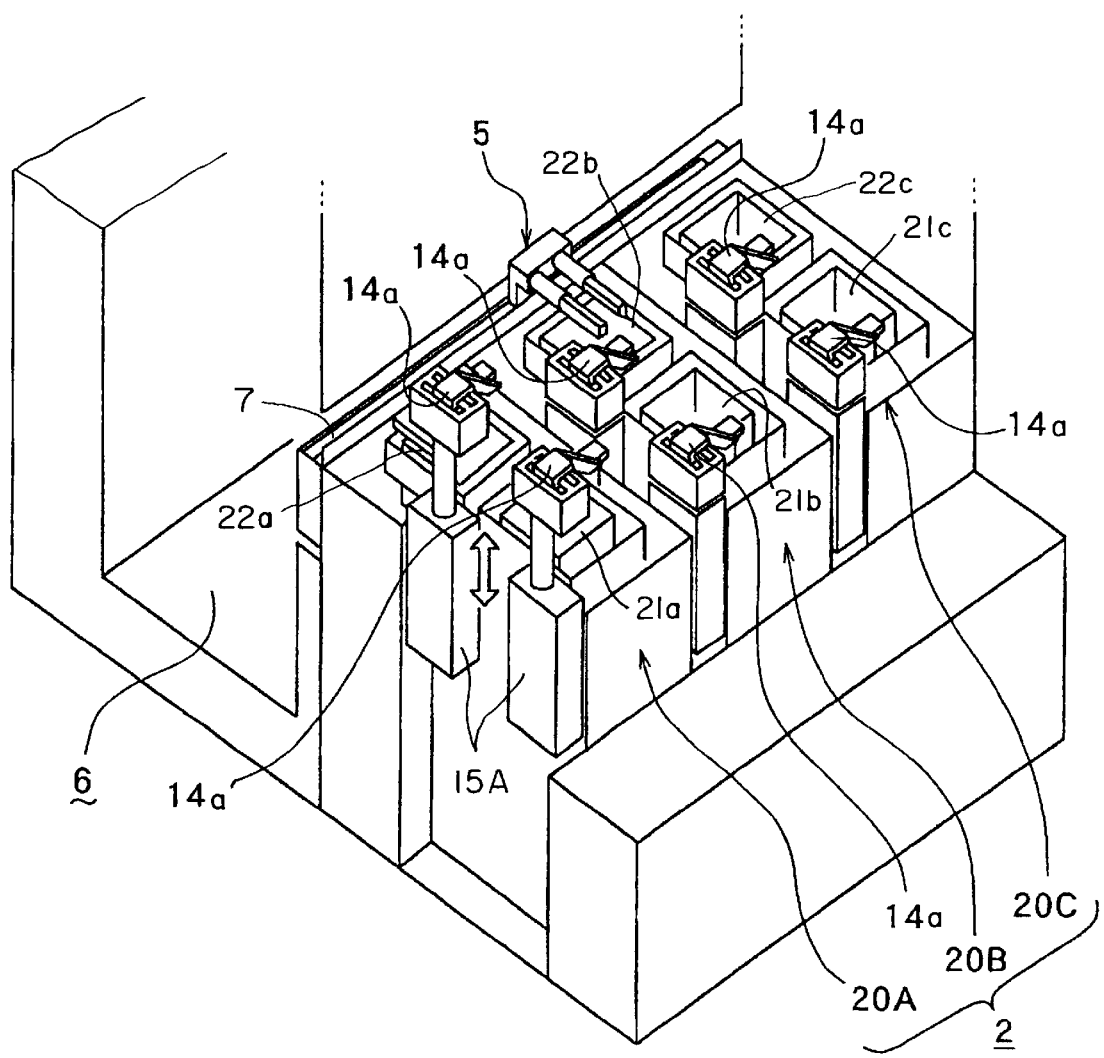
FIG. 7 is a schematic perspective view of essential components of a second embodiment of the treatment apparatus in accordance with the present invention.
Figure 8:
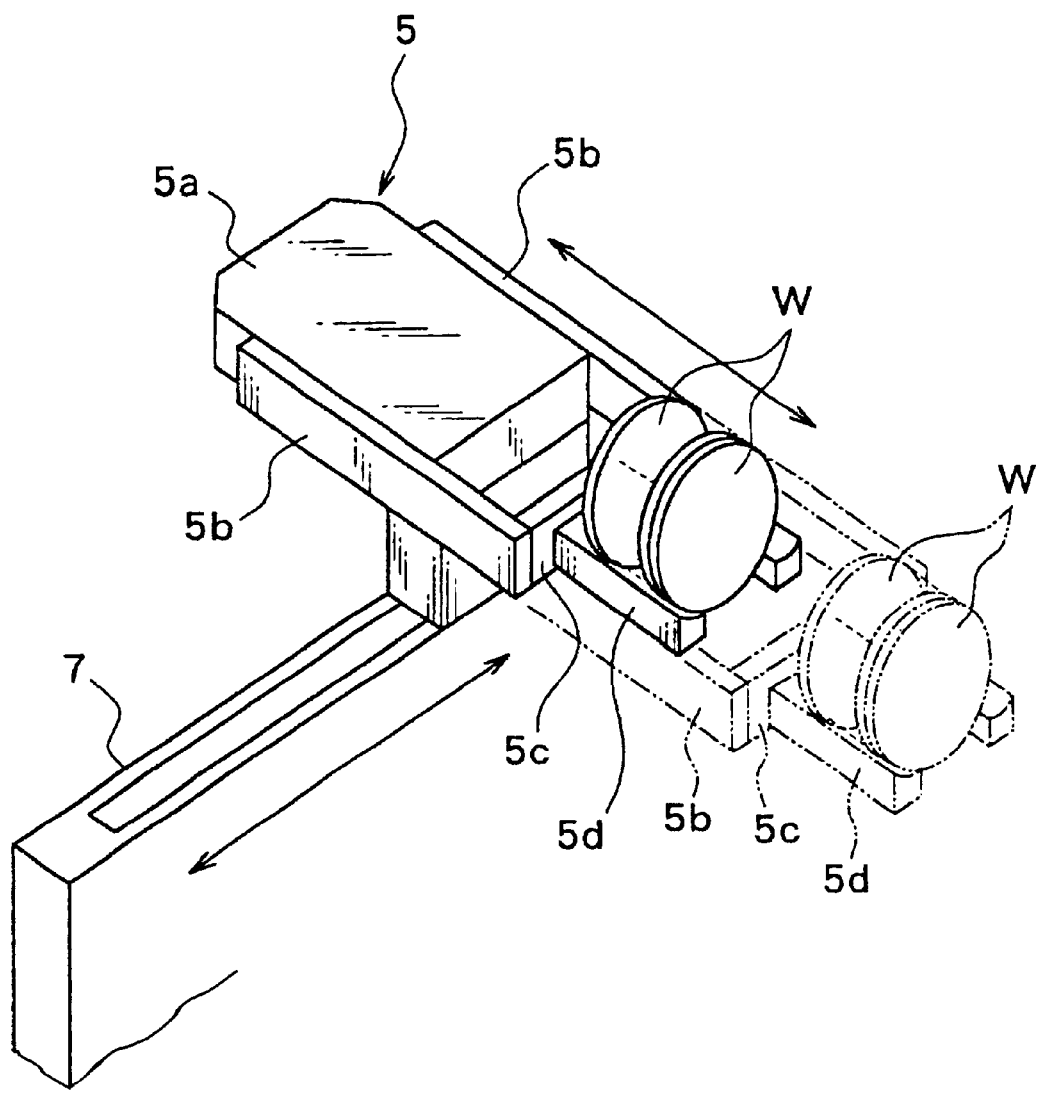
FIG. 8 is a perspective view of a wafer holder conveyor carriage in the second embodiment.

A perspective view of essential components of a second embodiment of the treatment apparatus in accordance with the present invention is shown in FIG. 7. A conveyor mechanism (wafer holder conveyor carriage) of this second embodiment is shown in FIG. 8.

The second embodiment of this invention makes it possible to reduce the size of the apparatus and also improve the processing efficiency thereof, in a similar manner to the first embodiment. In this case, the wafer holder conveyor carriage 5 is attached in a freely slidable manner to the conveyor rail 7 that is arranged on the boundary between the treatment section 2 and the maintenance/inspection section 6, in a similar manner to the first embodiment as described above. This wafer holder conveyor carriage 5 comprises a conveyor carriage body 5a which runs along the conveyor rail 7; a pair of extendable arms 5b which are supported in a slidable manner along side edges of the conveyor carriage body 5a and which extend and contract to above the chemical treatment tanks 21a to 21c and the rinse treatment tanks 22a to 22c; and a pair of protruding arm-shaped wafer holder sections 5d that are attached to the far end of the extendable arms 5b by a connective plate 5c that connects together the distal ends of the two extendable arms 5b; as shown in FIG. 8.

A transportation device for a wafer boat 14 is disposed in a position in the vicinity of the chemical treatment tanks 21a to 21c and the rinse treatment tanks 22a to 22c, in order to transport the wafer boat 14 so as to transfer a plurality of wafers W, such as fifty wafers, to and from the wafer holder conveyor carriage 5 and also lower the transferred wafers W into any of the chemical treatment tanks 21a to 21c or the rinse treatment tanks 22a to 22c. only the vertical suspender section 14a of the wafer boat 14 is shown in FIG. 7.

The configuration described above makes it possible to reduce the stroke of conveyance of the wafer holder conveyor carriage 5. In addition, after the wafers W have been moved to above any of the chemical treatment tanks 21a to 21c and the rinse treatment tanks 22a to 22c by extending the wafer holder sections 5d of the wafer holder conveyor carriage 5, the wafer boat 14 can be lowered so that the wafers W are lowered into the current tank from among the chemical treatment tanks 21a to 21c and the rinse treatment tanks 22a to 22c. It is therefore possible to reduce the size of the apparatus and also improve the processing efficiency thereof. In this embodiment of the invention, one wafer boat transportation device is provided for each of the chemical treatment tanks 21a to 21c and the rinse treatment tanks 22a to 22c. Each wafer boat transportation device is provided with a drive mechanism 15A that simply moves the wafer boat up and down.

Note that other sections of this second embodiment of the invention are similar to those in the previously described first embodiment, so similar components are given the same reference numerals and further description thereof is omitted.

Third Embodiment

Figure 9:
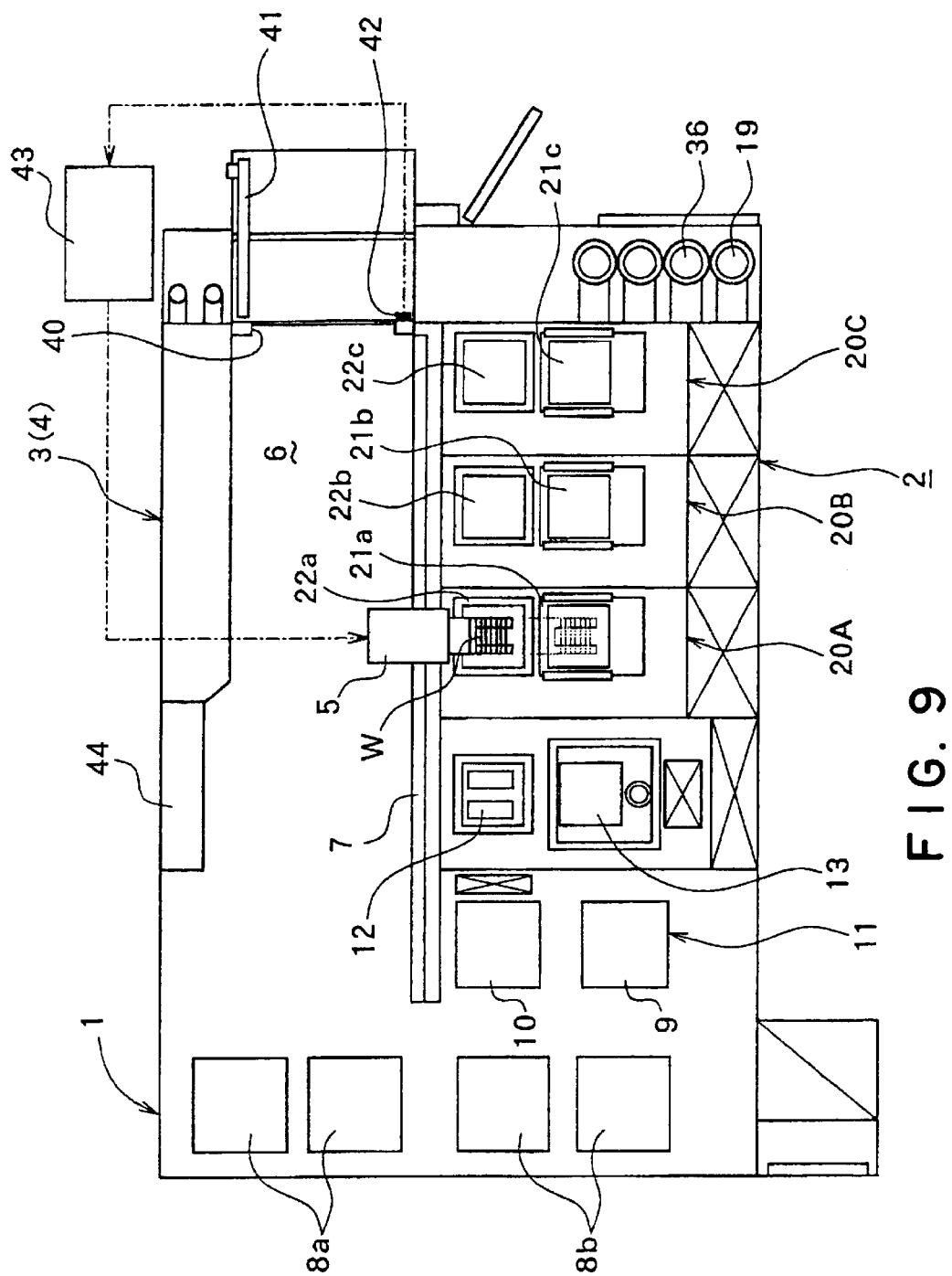
FIG. 9 is a schematic plan view of a third embodiment of the treatment apparatus in accordance with the present invention.

A plan view of the chemical treatment tanks 21a to 21c and the rinse treatment tanks 22a to 22c in accordance with a third embodiment of the present invention is shown in FIG. 9. Essential components of the conveyor device of this third embodiment are shown in FIG. 10.

This third embodiment is an example in which the conveyor device (the wafer holder conveyor carriage) is equipped with the function of a transportation device (a wafer boat transportation device). In this case, the wafer holder conveyor carriage 5 runs along the conveyor rail 7 in an X direction shown in FIG. 10, and is mainly configured of the conveyor carriage body 5a which can be raised and lowered in the vertical direction (the Z direction) by an elevator mechanism that is not shown in the figures; a pair of extendable arms 5e which are supported by the conveyor carriage body 5a, which extend and contract with respect to a direction that leads to above the chemical treatment tanks 21a to 21c and the rinse treatment tanks 22a to 22c (the Y direction in FIG. 10), and also rotate in the same positive or negative direction (the θ direction in FIG. 10); and holder bars 5g that are suspended between lower ends of support members 5f that descend from each of the far end and the near end of each of the extendable arms 5e; as shown in FIG. 10. The configuration is such that a plurality of wafers W, such as fifty wafers, are held in a state where the peripheral edges of the wafers W are retained in wafer holder grooves (not shown in the figure) formed in arrays at a suitable spacing on the holder bars 5g.

Using the wafer holder conveyor carriage 5 of the above described configuration makes it possible to extend the extendable arms 5e and thus transfer the plurality of wafers W, such as fifty wafers, that are held by the wafer holder conveyor carriage 5 to above any of the chemical treatment tanks 21a to 21c and the rinse treatment tanks 22a to 22c, and also cause the wafers to be lowered (conveyed inward) or raised (conveyed outward) by lowering or raising the conveyor carriage body 5a and rotating the extendable arms 5e in either direction so that the wafers W are either transferred to a wafer holder section (not shown in the figures) that is disposed within the corresponding one of the chemical treatment tanks 21a to 21c and the rinse treatment tanks 22a to 22c, or the wafers W are removed from this wafer holder section. It is therefore possible to subject the wafers W to the chemical treatments and rinse treatments by the wafer holder conveyor carriage 5 alone, without having to dispose a transportation device for the wafer boat 14 at a position in the vicinity of the chemical treatment tanks 21a to 21c and the rinse treatment tanks 22a to 22c, as shown in FIG. 9.

Note that other sections of this third embodiment of the invention are similar to those in the previously described first and second embodiments, so similar components are given the same reference numerals and further description thereof is omitted.

Fourth Embodiment

Figure 11:
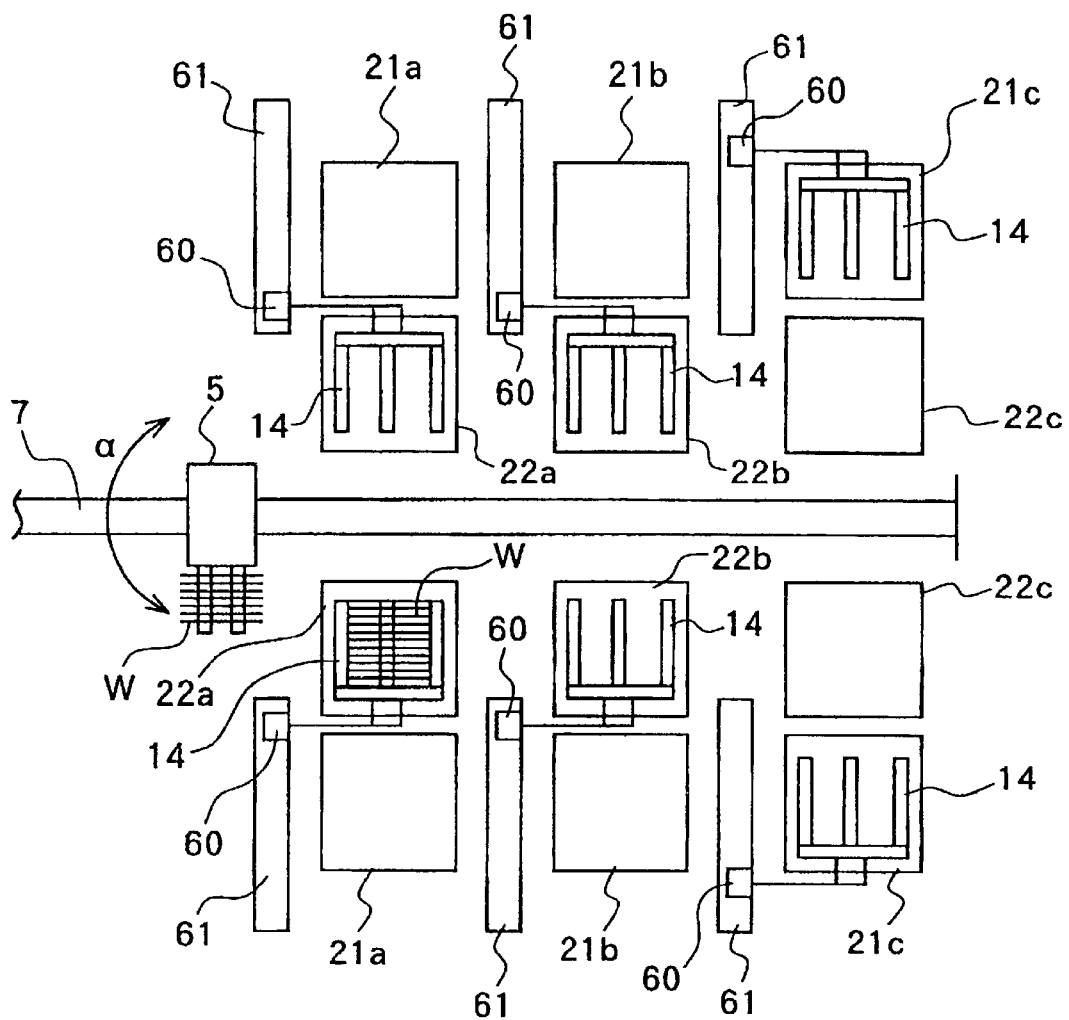
FIG. 11 is a schematic plan view of essential components of a fourth embodiment of the treatment apparatus in accordance with the present invention.

The previous embodiments of the present invention related to configurations in which the chemical treatment tanks 21a to 21c and the rinse treatment tanks 22a to 22c, which are the plurality of treatment vessels, are in mutual close proximity on one side of the conveyor rail 7 (conveyor path), but it is similarly possible to dispose the chemical treatment tanks 21a to 21c and the rinse treatment tanks 22a to 22c, which are the plurality of treatment vessels, in mutual close proximity on both sides of the conveyor rail 7 (conveyor path, as illustrated by a fourth embodiment of this invention that is shown in FIG. 11.

Note that if the chemical treatment tanks 21a to 21c and the rinse treatment tanks 22a to 22c are disposed on both sides of the conveyor rail 7, the wafer holder conveyor carriage 5 is formed to be capable of rotating in the horizontal plane so as to face towards either side (capable of rotating in the α direction in FIG. 11) and it is possible to transfer the wafers W by a single wafer holder conveyor carriage 5. In this case, the transportation device performs the transfer of the wafers W between the wafer holder conveyor carriage 5 and the wafer boat 14, in a similar manner to the previously described first embodiment, and is also disposed in such a manner as to cause the transferred wafers W to be lowered into the chemical treatment tanks 21a to 21c and the rinse treatment tanks 22a to 22c.

The description above concerns a case in which the wafer boat 14 moves between the chemical treatment tanks 21a to 21c and the rinse treatment tanks 22a to 22c and the wafers W are inserted into these treatment tanks 21a to 21c and 22a to 22c, but the configuration could equally well be such that the conveyor carriage body 5a of the wafer holder conveyor carriage 5 is formed to be extendable and a wafer boat 14 is provided in the vicinity of each of the treatment tanks 21a to 21c and 22a to 22c, in a similar manner to the above described second embodiment. Similarly, the configuration could also be such that no wafer boat 14 is used, and a wafer holder section of the wafer holder conveyor carriage 5, such as the holder bars 5g, are formed to be capable of extending, contracting, raising, and lowering, to lower the wafers W into the treatment tanks 21a to 21c and 22a to 22c, in a similar manner to the above described third embodiment.

Note that other sections of this fourth embodiment of the invention are similar to those in the previously described first to third embodiments, so similar components are given the same reference numbers and further description thereof is omitted.

Other Embodiments

In the embodiments described above, two of the chemical treatment tanks 21a to 21c and the rinse treatment tanks 22a to 22c, which are the plurality of treatment vessels, are disposed in close proximity, but it is equally possible to dispose more than two of these tanks in close mutual proximity, such as three or four tanks.

In addition, the embodiments above were described as relating to cases in which the present invention is applied to a treatment apparatus for semiconductor wafers, but it should be obvious that the principles of this invention can also be applied to work pieces other than semiconductor wafers, such as glass substrates for LCDs.

As described above, the present invention makes it possible to reduce the stroke of conveyance of the conveyor device and also makes it possible to accommodate the objects to be treated, such as wafers that have been conveyed by the conveyor device, into the different treatment vessels and process them therein, by using a single transportation device. This makes it possible to reduce the size of the apparatus and also improve the processing efficiency thereof.

Furthermore, by making it possible to transport the objects to be treated toward the plurality of treatment vessels, by forming the holder section of the conveyor device that holds the objects to be treated in such a manner that it extends and contracts freely toward the plurality of treatment vessels, it becomes possible to transport the objects to be treated to the various treatment vessels by the conveyor device alone, without using a transportation device. This makes it possible to reduce the number of structural components and also reduce the size of the treatment apparatus even further and improve the treatment efficiency.

What is claimed is:

1. A treatment apparatus comprising:
   a plurality of treatment vessels disposed in mutual close proximity, for processing an object;
   a holder conveyor carriage for holding said object to convey the object into said plurality of treatment vessels, said holder conveyor carriage being movable along a conveyor path in a fixed direction of conveyance; and
   said plurality of treatment vessels being disposed on one side of the conveyor path in a direction across said fixed direction of conveyance of said holder conveyor carriage as well as along said fixed direction of conveyance of said holder conveyor carriage.

2. The treatment apparatus as defined in claim 1, wherein said plurality of treatment vessels being disposed in said direction across said direction of conveyance of said holder conveyor carriage comprise at least a chemical treatment vessel and a rinse treatment vessel.

3. The treatment apparatus as defined in claim 2, wherein said rinse treatment vessel is disposed adjacent to said conveyor path.

4. The treatment apparatus as defined in claim 1, wherein each of said plurality of treatment vessels is a treatment tank that is open at the top.

5. The treatment apparatus as defined in claim 1, further comprising a conveyor rail extending along said direction of conveyance, said holder conveyor carriage being supported on said conveyor rail for movement therealong.

6. The treatment apparatus as defined in claim 5, further comprising a transportation device for transporting said object between said holder conveyor carriage and said treatment vessels, said treatment vessels disposed in the direction across said direction of conveyance of said holder conveyor carriage includes at least one rinse treatment vessel, wherein an area in which said object is transferred between said holder conveyor carriage and said transportation device is located above said rinse treatment vessel.

7. The treatment apparatus as defined in claim 1, wherein said holder conveyor carriage includes a conveyor carriage body for traveling along said conveyor rail and a holder device for the object, which is provided on said conveyor carriage body.

8. The treatment apparatus as defined in claim 7, further comprising a transportation device for transporting said object between said holder device of the holder conveyor carriage and said treatment vessels.

9. The treatment apparatus as defined in claim 8, further comprising a transportation device for transporting said object between said holder device for the object and interiors of said treatment vessels.

10. The treatment apparatus as defined in claim 8, wherein said transportation device includes a support member for supporting said object, a vertical movement mechanism for causing said support member to move vertically, and a horizontal movement mechanism for causing said vertical movement mechanism to move in a horizontal direction perpendicular to the movement direction of the vertical movement mechanism.

11. The treatment apparatus as defined in claim 6, wherein said holder device of said holder conveyor carriage is capable of expanding and contracting in a direction along aid plurality of treatment vessels disposed in a direction across said direction of conveyance of said conveyor carriage.

12. The treatment apparatus as defined in claim 6, wherein said holder device of said holder conveyor carriage is capable of expanding and contracting in a direction along said plurality of treatment vessels disposed in the direction across said direction of conveyance of said holder conveyor carriage, and said holder conveyor carriage includes a device for causing said holder mechanism to move along the fixed direction of conveyance of said holder conveyor carriage.

13. A treatment apparatus comprising:

a housing;

a plurality of treatment vessels disposed in mutual close proximity within said housing, for processing an object;

a holder conveyor carriage for holding said object to convey the object to said plurality of treatment vessels, said holder conveyor carriage being movable along a conveyor path in a fixed direction of conveyance within said housing; and said plurality of treatment vessels being disposed on one side of the conveyor path in a direction across said fixed direction of conveyance of said holder conveyor carriage as well as along said fixed direction of conveyance of said holder conveyor carriage.

14. The treatment apparatus as defined in claim 13, further comprising a treatment section including said treatment vessels, said treatment section being disposed on one side of said conveyor path; and a maintenance/inspection section provided within said housing on the other side of said conveyor path and separated from said treatment section by a partitioning wall.

15. The treatment apparatus as defined in claim 14, further comprising a transparent viewing window formed in said partitioning wall.

16. The treatment apparatus as defined in claim 14, further comprising a section for accommodating a control equipment and treatment fluids provided within said housing, on the side of said maintenance/inspection section, opposite from said treatment section.

17. A treatment apparatus comprising:

a housing;

a conveyor section for conveying an object into and out of said housing;

a plurality of treatment vessels disposed in mutual close proximity within said housing, for processing said object;

a drying device provided within said housing for drying said object;

a holder conveyor carriage for holding said object and moving between said conveyor section and said treatment vessels along a conveyor path in a fixed direction of conveyance, to convey the object to said drying device and said plurality of treatment vessels; and said plurality of treatment vessels being disposed on one side of the conveyor path in a crossing direction across said fixed direction of conveyance of said holder conveyor carriage as well as along said fixed direction of conveyance of said holder conveyor carriage.

18. The treatment apparatus as defined in claim 17, wherein said plurality of treatment vessels desposed in the direction across said fixed direction of conveyance of said holder conveyor carriage include a chemical treatment vessel and a rinse treatment vessel.

19. The treatment apparatus as defined in claim 17, wherein said plurality of treatment vessels desposed in a direction across said fixed direction of conveyance of said holder conveyor carriage are disposed in a plurality of rows along the direction of said conveyor path, and the plurality of rows include a row comprising only chemical treatment vessels and a row comprising only rinse treatment vessels.

* * * * *